United States Patent
Davidovic et al.

(10) Patent No.: US 9,438,241 B1
(45) Date of Patent: Sep. 6, 2016

(54) MULTIPURPOSE PADS USED AS DIGITAL SERIAL AND ANALOG INTERFACE

(71) Applicant: Avago Technologies General IP (Singapore) Pte. Ltd., Singapore (SG)

(72) Inventors: Milos Davidovic, Vienna (AT); Kurt Schweiger, Vienna (AT); Robert Swoboda, Vienna (AT)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/841,280

(22) Filed: Aug. 31, 2015

(51) Int. Cl.
*H03K 19/0185* (2006.01)
(52) U.S. Cl.
CPC ............... *H03K 19/018571* (2013.01)
(58) Field of Classification Search
CPC .............. H03K 19/018557; H03K 19/018571
See application file for complete search history.

(56) References Cited

U.S. PATENT DOCUMENTS

| | | | |
|---|---|---|---|
| 5,805,922 A | 9/1998 | Sim et al. | |
| 6,472,747 B2 | 10/2002 | Bazarjani et al. | |
| 7,046,035 B2 * | 5/2006 | Piasecki | G06F 13/4072 326/32 |
| 8,046,502 B2 | 10/2011 | Kim et al. | |
| 2015/0100716 A1 | 4/2015 | Rencs et al. | |

\* cited by examiner

*Primary Examiner* — Jeffrey Zweizig

(57) ABSTRACT

An Integrated Circuit, a system, and a method are provided. The disclosed Integrated Circuit may include a plurality of pads exposing internal components of the Integrated Circuit to external circuits, a digital interface connectable to the plurality of pads, an analog interface connectable to the plurality of pads, and sensing circuitry configured to detect whether a digital circuit or an analog circuit is externally connected to the plurality of pads and based on such detection selectively connect at least one of the digital interface and analog interface to the plurality of pads.

20 Claims, 5 Drawing Sheets

MULTIPURPOSE PADS USED AS DIGITAL SERIAL AND ANALOG INTERFACE

FIELD OF THE DISCLOSURE

The present disclosure is generally directed toward Integrated Circuits (ICs) and, more particularly, toward IC interfaces.

BACKGROUND

Space utilization in Integrated Circuit (IC) designs has always been an important concern. Increasing functionality is demanded within smaller spaces of the IC. Accordingly, it is highly desirable to optimization the space utilization of ICs, especially ICs that connect with external digital circuits and external analog circuits.

Up to now, the common way to optimize the area of an IC that is connectable to analog and digital circuitry was to fabricate Circuits Under Pads (CUPs) for the IC. Unfortunately, these CUPs, when positioned underneath the IC bonding pads, negatively impact the performance of the IC. Firstly, the CUPs create increased parasitics for the IC due to the close proximity of the metal bonding pads for the CUPs and the IC bonding pads and the circuits underneath. Secondly, the bonding procedure associated with utilizing the CUPs induces additional mechanical stresses.

BRIEF DESCRIPTION OF THE DRAWINGS

The present disclosure is described in conjunction with the appended figures, which are not necessarily drawn to scale.

DETAILED DESCRIPTION

Figure 1:
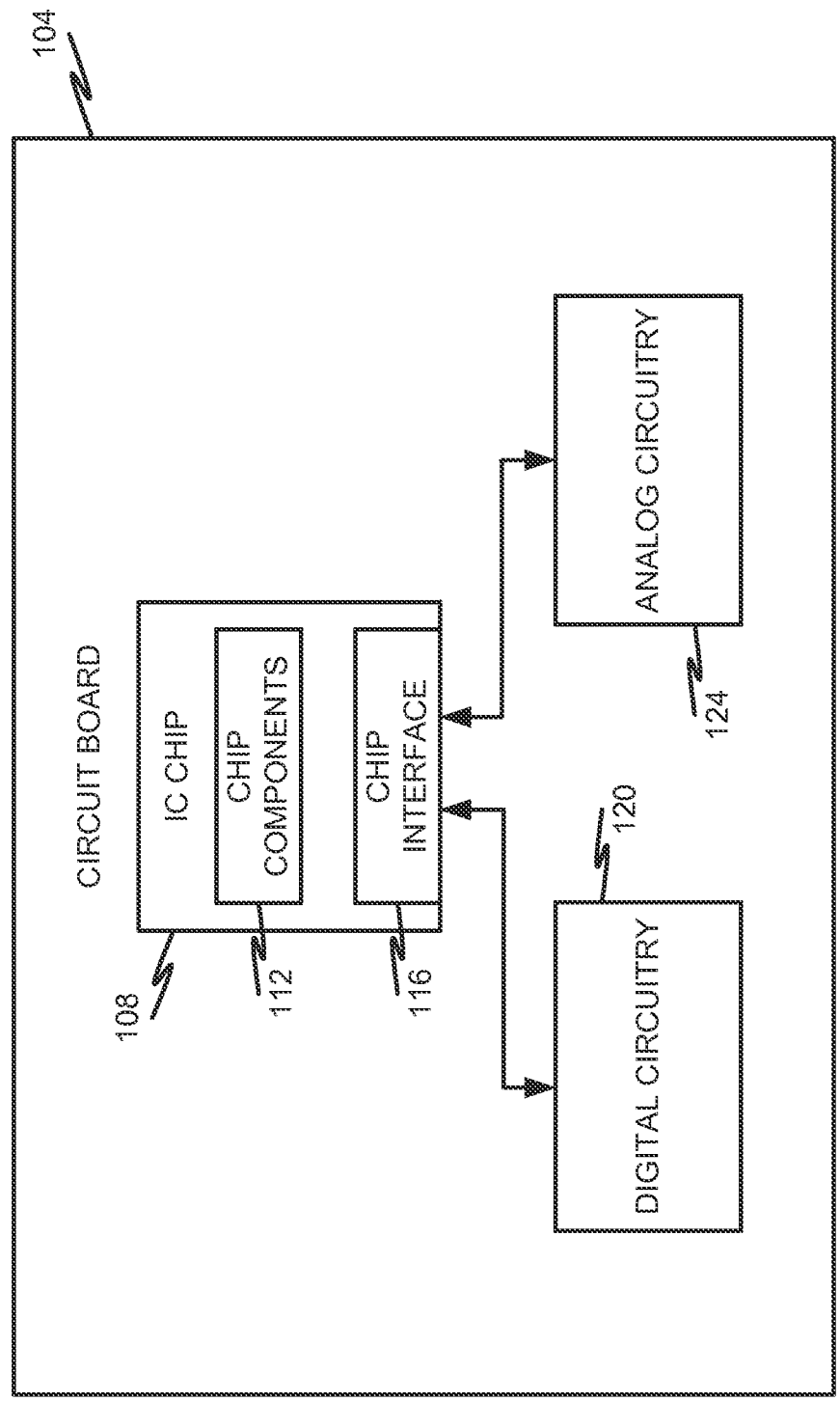
FIG. 1 is a block diagram depicting a circuit board in accordance with at least some embodiments of the present disclosure.

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

Various aspects of the present disclosure will be described herein with reference to drawings that are schematic illustrations of idealized configurations. As such, variations from the shapes of the illustrations as a result, for example, manufacturing techniques and/or tolerances, are to be expected. Thus, the various aspects of the present disclosure presented throughout this document should not be construed as limited to the particular circuit elements illustrated and described herein but are to include deviations in circuits and functionally-equivalent circuit components.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

It is with respect to the above-described shortcomings of IC chips that embodiments of the present disclosure were contemplated. In some embodiments, an IC chip is proposed in which the bonding pads of the IC chip are dual-purposed or reused to connect with digital and/or analog circuitry. By reusing the bonding pads of the IC chip for digital and analog connectivity, the space utilization of the IC chip is optimized without compromising the functionality of the IC chip as with previous solutions.

Embodiments of the present disclosure will be primarily described in connection with monolithically-fabricated integrated circuits on silicon and, particularly, in connection with deep submicron Complementary Metal-Oxide-Semiconductor (CMOS) technologies where the area reserved for the bonding pads takes a non-trivial amount of the total die area. Thus, reuse of the bonding pads for digital and/or analog connectivity greatly optimizes the space utilization of the IC chip. This space optimization also reduces the fabrication costs for the IC since a separate analog interface is no longer required. Further still, the same IC design can be used in different applications without requiring different types of IC chips—one for digital applications and another for analog applications. Although embodiments of the present disclosure are described in connection with monolithically-fabricated integrated circuits on silicon, it should be appreciated that the claims are not so limited. To the contrary, any type of IC chip or collection of IC chips using a single set of bonding pads for connectivity to different types of external circuits can benefit from the features disclosed herein.

In some embodiments, the proposed IC chip is configured such that the bonding pads of the IC chip traditionally dedicated to the digital serial interface (e.g., a Serial Peripheral Interface (SPI)) are dual-purposed for connectivity with an analog control interface, thereby enabling connectivity to the chip with either external digital or analog circuitry. Traditional SPIs are an interface bus commonly used to carry data between microcontrollers and small peripheral devices. Although embodiments of the present disclosure are described in connection with dual-purposing a SPI of an IC chip, it should be appreciated that any type of traditional digital or analog interface and its bonding pads can be extended to support connectivity to both digital and analog circuitry.

With reference now to FIG. 1, a circuit board 104 and components connected thereto will be described in accordance with at least some embodiments of the present disclosure. The circuit board 104 is shown to have an IC chip 108 mounted or connected thereto, along with digital circuitry 120 and analog circuitry 124. The IC chip 108 bonding pads may be mounted to the circuit board 104 by one or more thru-holes, vias, pins, bonding pads, etc. The circuit board 104 may comprise electrical traces or the like that facilitate electrical connectivity between the IC chip 108 and the external circuitry 120, 124. In some embodiments, the external circuitry 120, 124 may also be mounted to the circuit board 104 by one or more thru-holes, vias, pins, bonding pads, etc. The circuit board 104 may also provide a physical support for the IC chip 108, digital circuitry 120, and analog circuitry 120.

The digital circuitry 120 may comprise any form factor suitable for carrying digital circuit components (e.g., transistors, logic gates, registers, latches, switches, etc.). The digital circuitry 120 may include separate IC chips which may or may not have an improved interface as disclosed herein. The digital circuitry 120 may comprise any component or combination of components connected to one another that operate with a signal at one of two discrete levels or states.

The analog circuitry 124 may comprise one or many analog circuit components. Examples of analog circuit components that may be included in the analog circuitry 124 include, without limitation, resistors, capacitors, inductors, diodes, etc. The analog circuitry 124 may include any component or combination of components connected to one another that operate with any continuously variable signal. The analog circuitry 124 may comprise passive or active circuit components.

The IC chip 108 is shown to include chip components 112 and a chip interface 116. The chip components 112 may include any type of known digital circuit component implemented in silicon of the IC chip 108. The chip components 112 and their configuration may vary depending upon the desired functionality if the IC chip 108. The chip components 112 may comprise transistors, logic gates, registers, latches, switches, etc., similar to the digital circuitry 120.

The chip interface 116 enables connectivity between the internal chip components 112 and the external circuitry 120, 124. As will be described in further detail herein, the chip interface 116 may comprise a discrete number of bonding pads that can be dual-purposed for connectivity to the digital circuitry 120 and/or the analog circuitry 124. In some embodiments, the chip interface 116 may be configured to detect whether the external circuitry connected thereto is either digital circuitry 120 or analog circuitry 124 and then configure itself to appropriately connect the external circuitry 120, 124 to the chip components 112. Advantageously, the chip interface 116 does not require different bonding pads for digital and analog circuitry and, therefore, maximizes the space utilization of the bonding pads. Furthermore, an IC chip 108 may be designed for an application and the design does not have to vary depending upon whether the external circuitry 120, 124 is digital or analog. Instead, a single chip 108 distributed to and used by customers that implement external circuitry in the form of digital circuitry 120 and analog circuitry 124.

Figure 2:
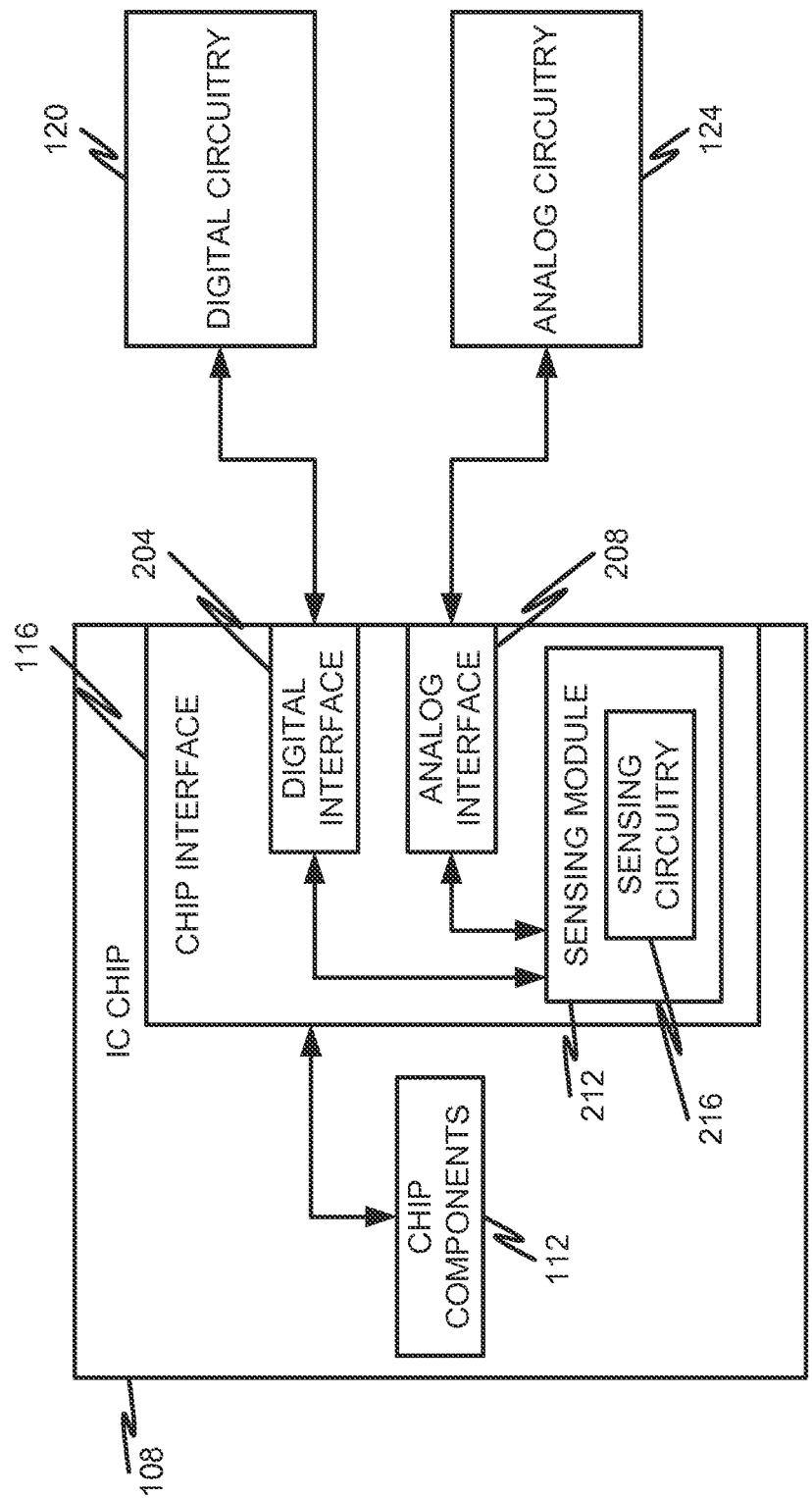
FIG. 2 is a block diagram depicting additional details of an IC chip interface in accordance with embodiments of the present disclosure.

With reference now to FIG. 2, additional details of the IC chip 108 and the chip interface 116 will be described in accordance with at least some embodiments of the present disclosure. The chip interface 116 is shown to include a digital interface 204 as well as an analog interface 208. As will be discussed in further detail herein, the digital interface 204 and analog interface 208 may both be exposed to the external circuitry 120, 124 by a shared set of bonding pads. In other words, a single set of bonding pads may be connected to either the digital interface 204 or the analog interface 208, depending upon whether the IC chip 108 is connected to digital circuitry 120 or analog circuitry 124.

The chip interface 116 is also shown to include a sending module 212, which comprises sensing circuitry 216. The sensing module 212 may comprise the ability to determine whether the external circuitry connected to the bonding pads of the IC chip 108 corresponds to digital circuitry 120 or analog circuitry 124. The sensing circuitry 216 may correspond to the component of the sensing module 212 responsible for detecting the type of circuitry connected to the chip interface 116. The sensing module 212 may also include functionality that enables the selective enablement/disablement of the digital interface 204 and analog interface 208, as appropriately determined by the sensing circuitry 216. In some embodiments, the sensing module 212 may be configured to enable and disable the interfaces 204, 208 by sending appropriate enable/disable messages or commands. The enable/disable commands may be as simple as a single bit (e.g., '0' equals disable and '1' equals enable). Alternatively or additionally, the sensing module 212 may be configured to enable/disable the interfaces 204, 208 by controlling whether or not the interfaces are physically connected to the bonding pads of the chip interface 116. In other words, there may be one or more physical switches between the interfaces 204, 208 and the bonding pads and the position of those physical switches may be controlled by operation of the sensing module 212 depending upon whether the external circuitry connected to the chip interface 116 is digital or analog in nature. Other more complicated architectures can also be envisioned without departing from the scope of the present disclosure.

Figure 3:
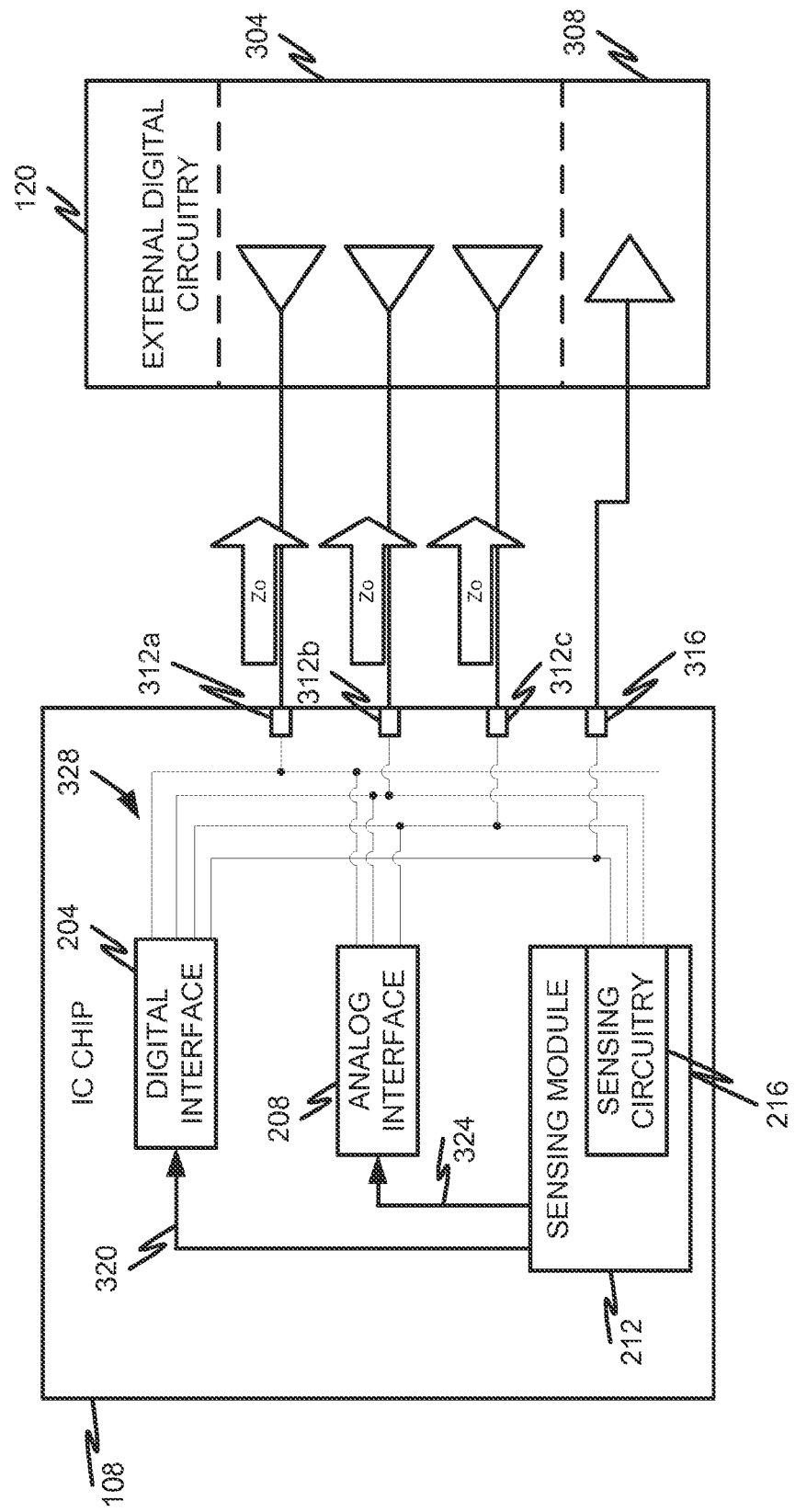
FIG. 3 is a block diagram showing further details of an IC chip interface and a connection to external digital circuitry in accordance with embodiments of the present disclosure.

With reference now to FIG. 3, further details of the chip interface 116 and its operation when connected with digital circuitry 120 will be described in accordance with at least some embodiments of the present disclosure. The IC chip 108 of FIG. 3 is shown to be connected with digital circuitry 120 comprising a plurality of digital drivers 304 as well as an input component 308. The digital drivers 304, in some embodiments, may correspond to CMOS drivers that comprise relatively low output impedance (e.g., an output impedance of less than about 10 kOhms). The input component 308 may comprise a CMOS input that receives digital signals from the IC chip 108 and provides such digital signals to the rest of the digital circuitry 120.

The physical interface between the chip 108 and external digital circuitry 120 comprises a plurality of bonding pads or exposed leads 312a-c and 316. Although the IC chip 108 is shown to comprise four bonding pads 312a-c and 316, it should be appreciated that a greater or lesser number of bonding pads may be utilized without departing from the scope of the present disclosure. The illustrative bonding pads comprise a plurality of input pads 312a-c and an output pad 316. In some embodiments, the pads may correspond to those types of pads traditionally used for an SPI interface. In such embodiments, the first input pad 312a may correspond to a Chip Select (CS) pad, a Serial Clock (SCLK) pad, and a Serial Data Input (SDI) pad. The output pad 316 may correspond to a Serial Data Output (SDO) pad. As mentioned above, the example of an SPI interface is provided as it is one of the more commonly-used digital serial interfaces;

however, it should be appreciated that embodiments of the present disclosure are not limited to the utilization of an SPI interface.

The external circuitry 120 has its digital drivers connected to the input pads 312a-c. Each of the digital drivers may provide digital input signals to the IC chip 108 via the bonding pads 312a-c. When the digital drivers 304 are connected to the input pads 312a-c, the impedance Zo of the digital drivers 304 can be sensed by the sensing circuitry 216, which is also connected to the input pads 312a-c via an interconnection bus 328. As the sensing circuitry 216 measures the impedance Zo of the external circuitry 120 connected to the input pads 312a-c, the sensing module 212 is able to determine whether the external circuitry is digital or analog in nature. For example, most digital drivers, such as CMOS drivers tend to have a low output impedance. Thus, the sensing circuitry 216 can measure the impedance Zo at the input pads 312a-c and provide this information to logic in the sensing module 212 that compares the measured impedance Zo with a threshold or expected range of impedance for digital drivers/circuitry. If the measured impedance Zo is below the threshold or within the expected range, then the sensing module 212 determines that the external circuitry connected to the bonding pads 312a-c and 316 is digital and appropriately enables the digital interface 204 and disables the analog interface 208.

As a non-limiting example, digital drivers such as CMOS drivers may have an impedance of no greater than 10 kOhms. Therefore, the impedance threshold may correspond to a value of 10 kOhms, 15 kOhms, or 20 kOhms. If the sensing circuitry 216 senses an impedance Zo below the threshold, then the external circuitry can be classified as digital. Alternatively, the sensing module 212 may be looking for the measured impedance Zo to be within a predefined range instead of comparing with a single threshold. For instance, the predefined range may lie between 1 Ohm and 10 kOhms. If the measured impedance Zo is found to be within the expected range, then the external circuitry may be classified as digital; otherwise, the external circuitry may be classified as analog.

It should be appreciated that the sensing circuitry 216 may be configured to sense characteristics or parameters other than impedance when determining whether external circuitry is digital or analog. For instance, the sensing circuitry 216 may analyze signal levels, capacitance, inductance, or the like when determining whether the external circuitry is digital or analog.

Once the sensing module 212 has determined that the external circuitry is digital circuitry 120, then sensing module 212 may cause the digital interface 204 to connect with the bonding pads 312a-c, 316 while simultaneously causing the analog interface 208 to disconnect from the bonding pads 312a-c, 316. The selective connection and disconnection of the interfaces 204, 208 can be achieved in a number of ways. As one example, the sensing module 212 may transmit an enable command to the digital interface 204 via a first control line 320 and then transmit a disable command to the analog interface 208 via a second control line 324.

As another example, a single control line may connect the sensing module 212 with both the digital interface 204 and analog interface 208. In this particular configuration, the sensing module 212 may transmit a single command that is acted on differently by the digital interface 204 and analog interface 208. Continuing this example, the sensing module 212 may transmit a binary command of '0', which causes the digital interface 204 to become active and connect with the bonding pads 312a-c, 316 whereas the command of '0' causes the analog interface 208 to become inactive and disconnect from the bonding pads 312a-c, 316.

As yet another example, the sensing module 212 may control physical switches that connect/disconnect the interfaces 204, 208 to/from the bonding pads 312a-c, 316. In this configuration, the sensing module 212 may operate the switches on the bus 328 to cause the digital interface 204 to be physically connected to the bonding pads 312a-c, 316 while simultaneously causing the analog interface 208 to be physically disconnected from the bonding pads 312a-c, 316.

Once connected, the digital interface 204 may receive digital input signals from the digital drivers 304 and provide digital output signals to the input component 308. The digital interface 204 may carry the input signals received from the drivers 304 to various chip components 112 of the IC chip 108. Likewise, output signals received from the chip components 112 may be provided to the input component 308. Thus, the information exchange between the chip components 112 and the external digital circuitry 120 is facilitated by the bonding pads 312a-c, 316 and digital interface 204.

Figure 4:
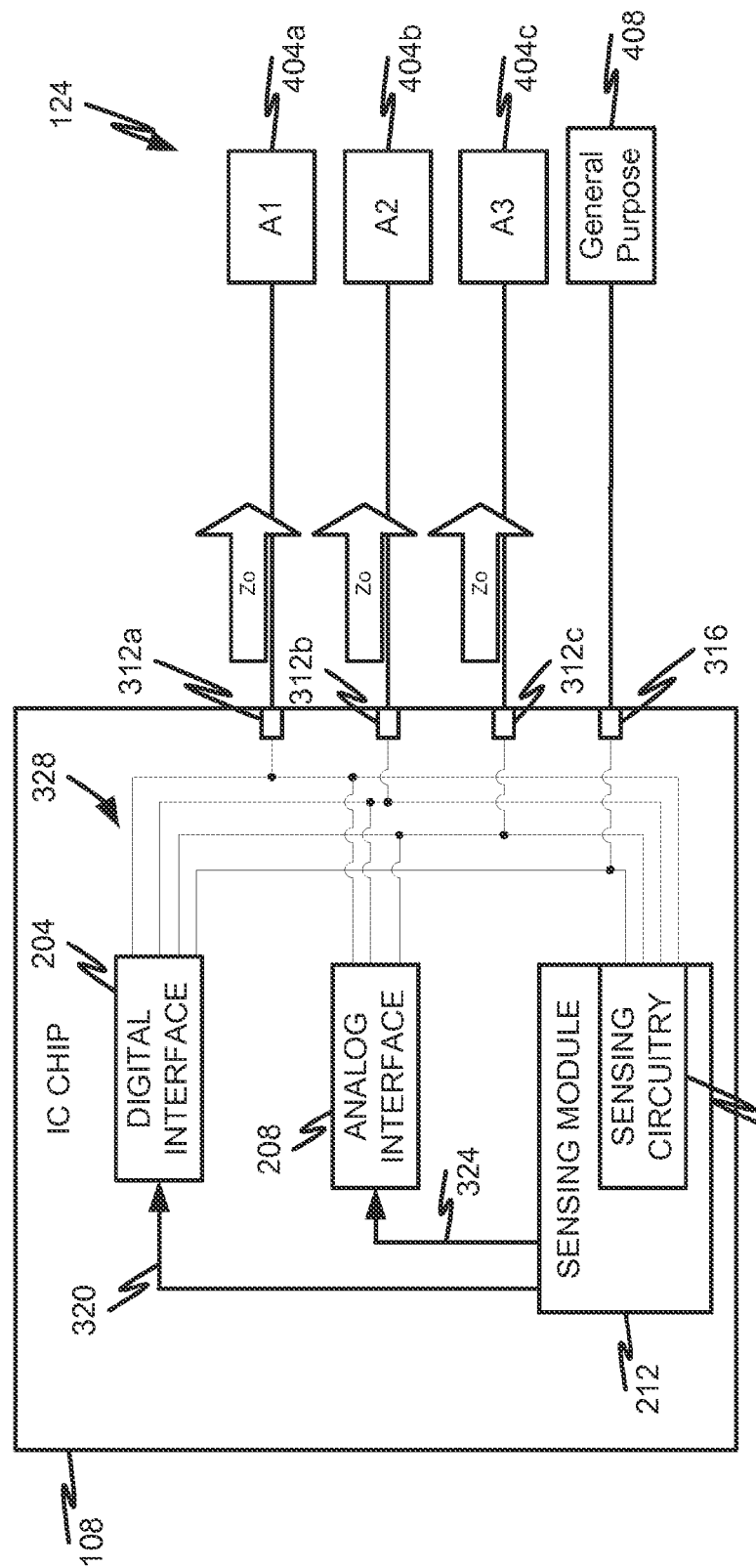
FIG. 4 is a block diagram showing further details of an IC chip interface and a connection to external analog circuitry in accordance with embodiments of the present disclosure.

With reference now to FIG. 4, the IC chip 108 is shown as being connected to analog external circuitry 124 instead of digital circuitry 120. In this situation, the analog interface 208 is activated/enabled whereas the digital interface 204 is deactivated/disabled. This causes the analog interface 208 to connect with the bonding pads 312a-c, 316 and communicate with the external analog circuitry 124.

In the depicted embodiment, the external analog circuitry 124 is shown to include three analog inputs 404a, 404b, 404c. In some embodiments, the three analog inputs 404a-c are configured to provide current to the bonding pads 312a-c. A general purpose output circuit 408 is also adapted to receive output signals from the output pad 316. It should be appreciated that not all of the bonding pads 312a-c, 316 need to be used to connect the IC chip 108 to the analog circuitry 124; however, all of the bonding pads 312a-c, 316 are available for use if needed.

In contrast to the digital circuitry 120, the analog circuitry may have a relatively high impedance as measured by the sensing circuitry 216. Thus, if the sensing circuitry 216 senses an impedance equal to or greater than a threshold impedance at one or all of the input pads 312a-c, then the sensing module 212 may determine that analog circuitry 124 is connected to the bonding pads and may, in response to making such a determination, enable the analog interface 208 while simultaneously disabling the digital interface 204.

Figure 5:
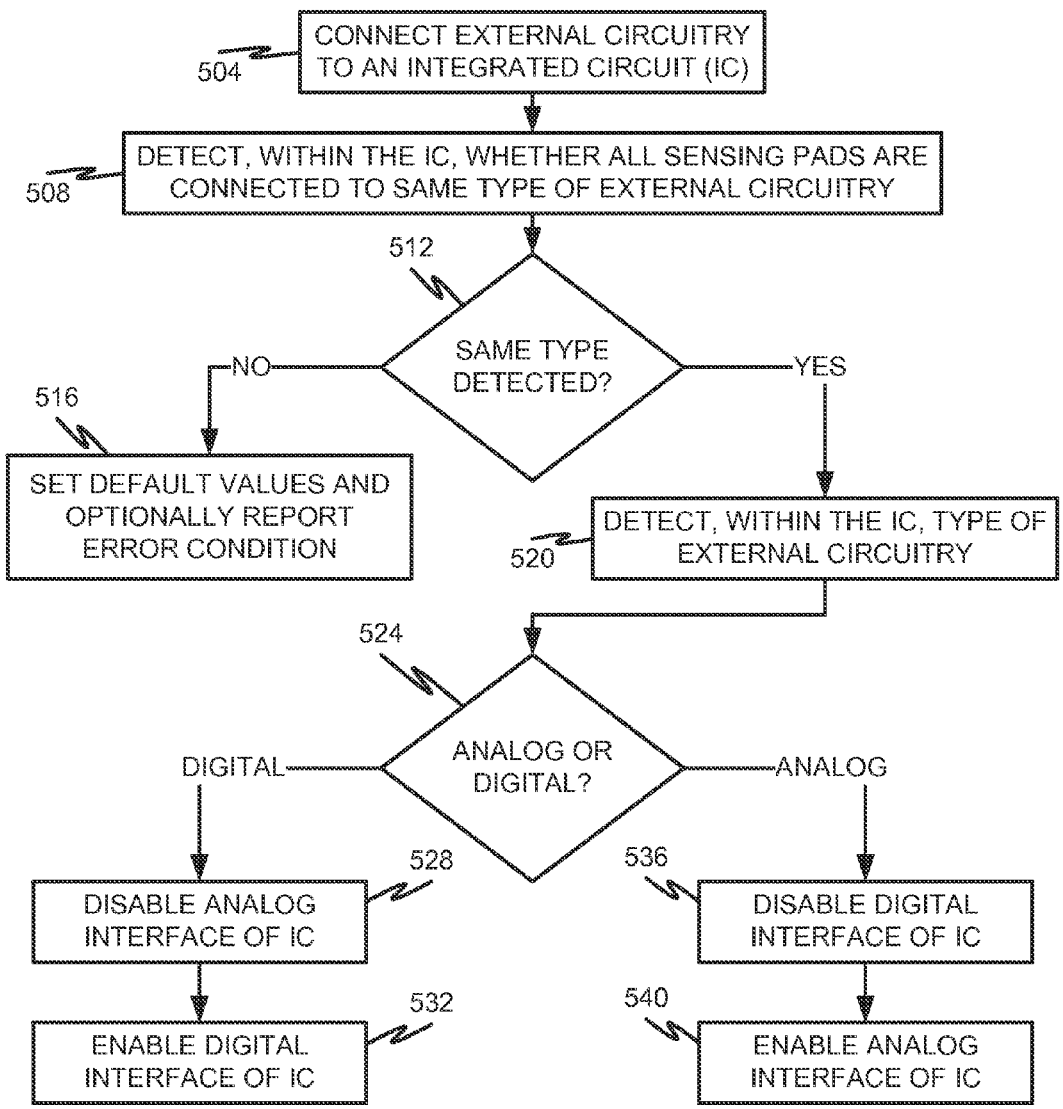
FIG. 5 is a flow diagram depicting a method of operating an IC chip interface in accordance with at least some embodiments of the present disclosure.

With reference now to FIG. 5, an illustrative but non-limiting example of a method of operating the IC chip 108 and its interface 116 will be described in accordance with at least some embodiments of the present disclosure. The method begins by connecting external circuitry to the IC chip 108 (step 504). This may be done by connecting one or more of the bonding pads 312a-c, 316 to traces, thru hoes, vias, etc. of the circuit board 104 and then connecting other circuitry to the circuit board 104 and allowing the traces on the circuit board 104 to connect the IC chip 108 to the external circuitry.

The IC chip 108 is then powered up and the sensing circuitry 216 of the IC chip 108 is used to detect the nature or type of external circuitry connected thereto (step 508). In a first phase of analysis, the sensing circuitry 216 and sensing module 212 may collectively determine if all pads 312a-c detect the same type of external circuitry. That is, a determination will be made as to whether or not each of the pads 312a-c is connected exclusively to digital circuitry, connected exclusively to analog circuitry, or whether some of the pads are connected to digital circuitry whereas other pads are connected to analog circuitry (step 512). If the pads 312a-c are connected to a mix of both analog and digital circuitry, then the IC chip 108 may determine that an error condition is present, set default operating values to avoid damage to the IC chip 108, and optionally report the detected error condition (step 516).

As discussed above, the sensing circuitry 216 may measure the impedance of the external circuitry connected to the bonding pads 312a-c as part of executing steps 508 and 512. Alternatively or additionally, the sensing circuitry 216 may sense other properties of the external circuitry to try and determine whether the external circuitry corresponds to analog or digital circuitry.

If the sensing circuitry 216 and sensing module 212 determine that the pads are all connected to the same type of external circuitry, then the method continues with the sensing circuitry 216 and sensing module 212 collectively determining whether the external circuitry is analog or digital (step 520). In some embodiments, this determination may be made by comparing the measured property (e.g., impedance) with an expected range or predetermined threshold. Depending upon whether the measured property is within the expected range (or outside that range) or below the threshold, the external circuitry can be determined as being either digital or analog in nature (step 524).

If the external circuitry is determined to be digital, then the method proceeds with the sensing module 212 disabling the analog interface 208 (step 528) and enabling the digital interface 204 (step 532) of the chip interface 116. In some embodiments, steps 528 and 532 may be performed substantially simultaneously. In some embodiments, steps 528 and 532 may be performed sequentially, either in the order shown in FIG. 5 or in reverse order (e.g., enable digital interface before disabling analog interface).

Referring back to step 524, if the external circuitry is determined to be analog, then the method proceeds with the sensing module 212 disabling the digital interface (step 536) and enabling the analog interface 208 (step 540) of the chip interface 116. In some embodiments, steps 536 and 540 may be performed substantially simultaneously. In some embodiments, step 536 and 540 may be performed sequentially, either in the order shown in FIG. 5 or in reverse order (e.g., enable the analog interface before disabling the digital interface).

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. An Integrated Circuit, comprising:
a plurality of pads exposing internal components of the Integrated Circuit to external circuits;
a digital interface connectable to the plurality of pads;
an analog interface connectable to the plurality of pads; and
sensing circuitry configured to detect whether a digital circuit or an analog circuit is externally connected to the plurality of pads and based on such detection selectively connect at least one of the digital interface and analog interface to the plurality of pads.

2. The Integrated Circuit of claim 1, wherein only one of the digital interface and analog interface is capable of being connected to the plurality of pads at any given time.

3. The Integrated Circuit of claim 2, wherein the sensing circuitry comprises impedance sensing circuitry.

4. The Integrated Circuit of claim 3, wherein the impedance sensing circuitry detects whether an external circuit connected to the plurality of pads comprises an impedance within a specified range and in the event that the detected impedance is not within the specified range, then the analog interface is connected to the plurality of pads and the digital interface is disconnected from the plurality of pads.

5. The Integrated Circuit of claim 4, wherein the specified range corresponds to an impedance range specified for Complementary Metal-Oxide-Semiconductor (CMOS) drivers of the internal components of the Integrated Circuit.

6. The Integrated Circuit of claim 3, wherein the impedance sensing circuitry comprises an output buffer.

7. The Integrated Circuit of claim 1, wherein the plurality of pads include a first input pad, a second input pad, and a third input pad.

8. The Integrated Circuit of claim 6, wherein the plurality of pads include a fourth pad, wherein the fourth pad is capable of operating as an input pad or an output pad.

9. The Integrated Circuit of claim 1, wherein the digital interface comprises a digital serial interface.

10. The Integrated Circuit of claim 1, wherein the digital interface and analog interface are selectively connected to the plurality of pads by at least one of physical switches and logic signals provided to the digital interface and analog interface causing the digital interface and analog interface to turn ON and OFF.

11. A system, comprising:
an Integrated Circuit having a plurality of pads and an interface that connects the plurality of pads to internal components of the Integrated Circuit;
external circuitry connectable to the plurality of pads; and
a sensing module configured to detect whether the external circuitry corresponds to digital or analog circuitry and based on such detection switch the interface of the Integrated Circuit between an analog mode of operation and a digital mode of operation.

12. The system of claim 11, wherein the sensing module comprises sensing circuitry incorporated in the Integrated Circuit.

13. The system of claim 11, wherein the sensing module senses an impedance of the external circuitry to determine whether to operate the interface in the analog mode of operation or the digital mode of operation.

14. The system of claim 13, wherein the sensing module causes the interface to operate in the digital mode of operation when the impedance of the external circuitry is determined to be less than a predetermined threshold.

15. The system of claim 13, wherein the sensing module causes the interface to operate in the analog mode of operation when the impedance of the external circuitry is determined to be greater than or equal to a predetermined threshold.

16. The system of claim 11, wherein the interface comprises both an analog interface and a digital interface, wherein while the interface is operating in the analog mode of operation the analog interface is connected to the plurality of pads and the digital interface is disconnected from the plurality of pads, and wherein while the interface is operating in the digital mode of operation the analog interface is disconnected from the plurality of pads and the digital interface is connected to the plurality of pads.

17. The system of claim 16, wherein the digital interface comprises a digital serial interface, wherein the plurality of pads are used as digital serial interface pads during the digital mode of operation, and wherein the plurality of pads are used as analog current inputs and outputs during the analog mode of operation.

18. A method, comprising:
- connecting external circuitry to an Integrated Circuit via a plurality of pads;
- detecting, within the Integrated Circuit, whether the external circuitry corresponds to digital or analog circuitry; and
- based on whether the external circuitry is detected as corresponding to digital or analog circuitry, switching an interface of the Integrated Circuit into one of a digital mode of operation and an analog mode of operation.

19. The method of claim 18, wherein detecting whether the external circuitry corresponds to digital or analog circuitry comprises sensing an impedance of the external circuitry and wherein detecting whether the external circuitry corresponds to digital or analog circuitry further comprises comparing the sensed impedance of the external circuitry to an impedance threshold.

20. The method of claim 18, further comprising:
- determining whether each of the plurality of pads are connected to a same type of external circuitry; and
- in the event that the plurality of pads are determined not to be connected to the same type of external circuitry, setting operational values of the Integrated Circuit to default operational values.

* * * * *